US006756732B1

(12) United States Patent
Kawase

(10) Patent No.: US 6,756,732 B1
(45) Date of Patent: Jun. 29, 2004

(54) DISTRIBUTED BRAGG REFLECTOR, ORGANIC LIGHT EMITTING ELEMENT, AND MULTICOLOUR LIGHT EMITTING DEVICE

(75) Inventor: Takeo Kawase, Cambridge (GB)

(73) Assignee: Cambridge University Technical Services, Ltd., Cambridge (GB)

(*) Notice: Subject to any disclaimer, the term of this patent is extended or adjusted under 35 U.S.C. 154(b) by 73 days.

(21) Appl. No.: 09/890,060

(22) PCT Filed: Nov. 22, 2000

(86) PCT No.: PCT/GB00/04439

§ 371 (c)(1),
(2), (4) Date: Aug. 31, 2001

(87) PCT Pub. No.: WO01/39286

PCT Pub. Date: May 31, 2001

(30) Foreign Application Priority Data

Nov. 26, 1999 (GB) .............................................. 9928121

(51) Int. Cl.⁷ .............................. H01J 1/62; G02B 1/04; H05B 33/00
(52) U.S. Cl. ........................ 313/504; 313/506; 313/110; 359/589
(58) Field of Search ................................ 313/504, 506, 313/511, 498, 110, 113; 272/92; 359/586, 587, 589; 428/917, 212, 690; 438/29

(56) References Cited

U.S. PATENT DOCUMENTS

| 4,162,343 A | | 7/1979 | Wilcox et al. |
| 5,044,736 A | * | 9/1991 | Jaskie et al. ................. 359/291 |
| 5,122,905 A | * | 6/1992 | Wheatley et al. ............ 359/586 |
| 5,793,062 A | * | 8/1998 | Kish et al. ..................... 257/98 |
| 5,834,893 A | * | 11/1998 | Bulovic et al. .............. 313/506 |
| 5,891,554 A | | 4/1999 | Hosokawa et al. |
| 6,137,819 A | * | 10/2000 | Najda .......................... 372/96 |
| 6,337,222 B1 | * | 1/2002 | Shimoda et al. .............. 438/29 |
| 6,368,699 B1 | * | 4/2002 | Gilbert et al. .............. 428/212 |
| 6,459,514 B2 | * | 10/2002 | Gilbert et al. ................ 359/15 |

FOREIGN PATENT DOCUMENTS

| EP | 0 426 636 A2 | 5/1991 |
| EP | 0 469 732 A2 | 2/1992 |
| EP | 0 469 732 A | 2/1992 |
| EP | 0 540 215 A2 | 5/1993 |
| EP | 0 616 488 A | 9/1994 |
| WO | WO 93/15906 | 8/1993 |
| WO | WO 97/01440 | 1/1997 |
| WO | WO 97 01774 A | 1/1997 |
| WO | WO 99 39373 A | 8/1999 |
| WO | WO 99 43031 A | 8/1999 |

OTHER PUBLICATIONS

Convertino A et al: "Organic multilayers as disturbuted Bragg reflectors," *APPLIED PHYSICS LETTERS,* Jul 1999, vol. 75, pp. 322–324, XP000850804, ISSN: 0003–6951.
"Vertical–cavity organic LED display," *IBM TECHNICAL DISCLOSURE BULLETIN,* 1997, vol. 40, pp. 165–167.

* cited by examiner

Primary Examiner—Nimeshkumar D. Patel
Assistant Examiner—Karabi Guharay
(74) Attorney, Agent, or Firm—Oliff & Berridge, PLC

(57) ABSTRACT

A distributed Bragg reflector comprising a stack of alternate layers of a first material and a second material wherein the first and second materials are both organic materials. An organic electroluminescent light emitting element comprising: a transparent substrate, a transparent electrode formed on the substrate, a distributed Bragg reflector formed on the transparent electrode, an organic electroluminescent light emitting material formed on the distributed Bragg reflector, and an electrode formed on the light emitting material.

25 Claims, 3 Drawing Sheets

US 6,756,732 B1

DISTRIBUTED BRAGG REFLECTOR, ORGANIC LIGHT EMITTING ELEMENT, AND MULTICOLOUR LIGHT EMITTING DEVICE

BACKGROUND OF THE INVENTION

1. Field of the Invention

The present invention relates to distributed Bragg reflectors and to organic electroluminescent light emitting devices (hereinafter referred to as OELDs). In one aspect, the invention is concerned with improvement of the output characteristics of OELDs.

2. Description of the Related Art

A schematic illustration of the output spectrum of a conventional OELD is shown in FIG. 1, from which it will be appreciated that the spectrum has a long tail towards higher wavelengths. The output spectrum illustrated in FIG. 1 is undesirable because pure colours can not be obtained.

The structure of an OELD is shown in FIG. 2. The structure comprises, in sequence, a transparent substrate 10 (for example, formed of glass), a distributed Bragg reflector (hereinafter referred to as a DBR) 12, a transparent electrode 14 (an anode, for example formed of Indium Tin Oxide), an organic electroluminescent light emitting layer 16, and a cathode 18. The cathode 18 and DBR 12 act as mirrors and the structure functions as a microcavity, in much the same way as the conventional laser structure. Spontaneous emission from the active material within the cavity is enhanced at the mode (or design) wavelength of the cavity and suppressed elsewhere. The desire is to gain sufficient control to enable the practical implementation of multicolour organic light emitting devices. In order to implement a full colour device, the DBR must have high reflectivity over the whole visible spectrum.

The DBR consists of a stack of inorganic dielectric films, with alternate layers of two materials having a difference in refractive index therebetween. For example, one layer may be formed of Titanium dioxide ($TiO_2$), with a refractive index of approximately 2, and the other may be formed of Silicon dioxide ($SiO_2$), with a refractive index of approximately 1.5. The materials are selected so as to maximise reflectivity and minimise absorption. The smaller the difference between the refractive index of the two materials, the sharper is the selectivity of the wavelength of the reflected light. That is, the width of the stop band is approximately $\lambda \Delta n/n$ where $\Delta n$ is the index difference between the layers that constitute the DBR, $\lambda$ is the centre wavelength of the stop band and n is the average refractive index. Thus it will be apparent that the materials just mentioned can not cover the whole visible spectrum, as required.

An arrangement of the type described above is disclosed in an article by Tetsuo Tsutui et al, Applied Physics Letters 65 (15) p.1868, 10th, Oct. 1994.

Formation of a DBR of the described type is by way of deposition processes. These processes are very time consuming and significantly more difficult than, for example, the deposition of metal films. The dioxide materials used for the DBR deposit on the walls of the fabrication chamber and flake off easily, thus causing contamination. The structure described with reference to FIG. 2 is thus not practicable for commercial fabrication and is too troublesome to produce a DBR which varies across a substrate so as to provide different wavelength selectivity across different portions of the substrate.

SUMMARY OF THE INVENTION

According to a first aspect of the present invention there is provided a distributed Bragg reflector comprising a stack of alternate layers of a first material and a second material wherein the first and second materials are both organic materials.

According to a second aspect of the present invention there is provided an organic electroluminescent light emitting element comprising: a transparent substrate, a transparent electrode formed on the substrate, a distributed Bragg reflector formed on the transparent electrode, an organic electroluminescent light emitting material formed on the distributed Bragg reflector and an electrode formed on the light emitting material, the distributed Bragg reflector being in accordance with the first aspect of the invention.

According to a third aspect of the present invention there is provided a multicolour light emitting device comprising a plurality of light emitting elements according to the second aspect of the invention.

According to a fourth aspect of the present invention there is provided a method of manufacturing a distributed Bragg reflector comprising the steps of forming a stack of alternate layers of a first organic material and a second organic material using inkjet technology.

According to a fifth aspect of the present invention there is provided a method of manufacturing an organic electroluminescent light emitting element comprising the steps of: providing a transparent substrate, forming a transparent electrode formed on the substrate, forming a distributed Bragg reflector on the transparent electrode using the method of the fourth aspect of the invention, forming an organic electroluminescent light emitting material on the distributed Bragg reflector, and forming an electrode on the light emitting material.

According to a sixth aspect of the present invention there is provided a method of manufacturing a multicolour light emitting device comprising the steps of: forming a plurality of light emitting elements using the method of the fifth aspect of the invention and therein forming the first and second materials in different thickness layers to provide different mode wavelength areas on the substrate.

BRIEF DESCRIPTION OF THE DRAWINGS

Embodiments of the present invention will now be described by way of further example only and with reference to the accompanying drawings, in which.

DETAILED DESCRIPTION OF PREFERRED EMBODIMENTS

Figure 2:
FIG. 2 illustrates the structure of a micro-cavity OELD using a distributed Bragg reflector.
Figure 3:
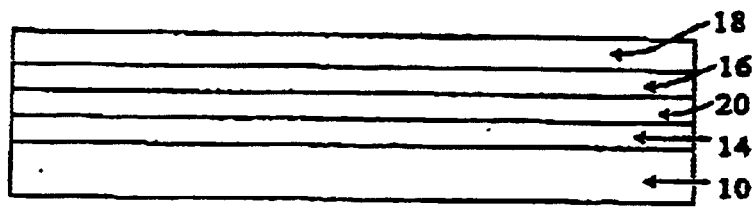
FIG. 3 illustrates the structure of an OELD according to one embodiment of the present invention.

An embodiment of the present invention has the structure illustrated in FIG. 3. It will be apparent that the structure of FIG. 3 has the positions of the anode and DBR reversed between the substrate and the light emitting layer, as compared with the structure of FIG. 2. In the embodiment of the invention, the nature of the DBR is fundamentally different from the conventional arrangement, described above. Specifically, the DBR according to this embodiment of the present invention is formed not of inorganic dielectric materials but is instead formed of semiconductive or conductive materials. As will be apparent, the structure of FIG. 3 will not function if the DBR is formed of insulating or dielectric materials, because these would block the current flow which activates the electroluminescent material. Further, locating the ITO layer outside the cavity as in FIG. 3 has the advantage that the absorption characteristics of the ITO do not significantly affect the loss in the cavity.

Particularly significant in the structure illustrated in FIG. 3 is the use of organic materials to form the DBR 20. Thus, the layers of the DBR 20 may be formed of a single organic polymer; such as PPV having a refractive index of approximately 2.6. In this embodiment, the layers of the DBR differ from each other by the addition to alternate layers of nano-meter sized particles of $TiO_2$ and of $SiO_2$, respectively. The size and number of particles added to the polymer is such that effectively no discernible scattering is caused. If, for example, micro-meter sized particles are used rather than nano-meter sized particles then scattering becomes a problem.

Fabrication of the structure described above with reference to FIG. 3 is significantly easier than that described with reference to FIG. 2. Specifically, techniques other than physical vapour deposition (sputtering, e-beam etc) can be used to fabricate the DBR.

Although reference is made to a number of alternate layers of two materials being used to form the DBR, the number of layers of each material is determined in accordance with the practical implementation required. Preferably, the layers are arranged having regard to the characteristics of the anode and the light emitting material so as to provide a continuous sequence, including the anode/DBR/light emitting material, of high/low/high (or low/high/low) refractive index/energy band gap. Embodiments of the invention have been tested using, two layers of one material with a single layer of the other material therebetween up to an alternately layered stack of five layers of one material and four layers of the other material. All of these embodiments showed markedly improved wavelength selectivity compared with the conventional output spectrum illustrated in FIG. 1. The selectivity increases with the increased number of layers used in the DBR.

Typically the thickness of the layers of the DBR will be selected to satisfy the equation:

$$d1*n1+d2*n2=\lambda/2$$

where d1 and d2 are the thickness of the alternate (first and second) layers respectively and n1 and n2 are the refractive indices thereof, respectively. The layer thickness of the DBR materials may typically vary between 50 nm to 250 nm. The ITO thickness is optimised with respect to optical and electrical characteristics and may typically be of the order of 200 nm. However, none of these values are limiting of the invention.

A change in cavity thickness of 20 nm can cause a change in peak wavelength selectivity of the DBR of approximately 15 nm, depending on the materials used.

A conductive DBR could, of course, be formed from inorganic materials such as GaAs and AlGaAs. However, such a DBR presents a high electrical resistance.

The luminescence turn-on voltage of a conventional OELD is approximately 2V and some embodiments of the present invention have been shown to retain this value. The value can however be allowed to rise to about 8V, as may be required due to increased DBR electrical resistance of some embodiments, while still remaining practicable.

Figure 4:
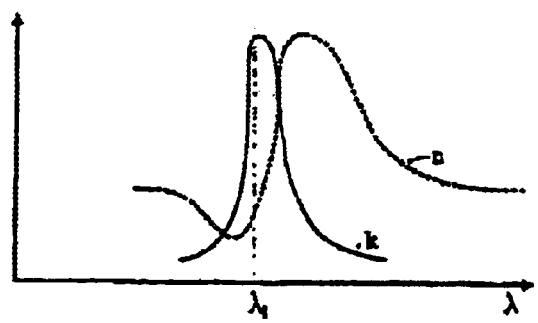
FIG. 4 is a graph illustrating optical characteristics of a material used in the DBR of the embodiment shown in FIG. 3.

For ease of presentation, FIG. 4 illustrates the optical characteristics of one of the polymer layers of the DBR used in the device illustrated in FIG. 3. The graph of FIG. 4 shows variation of absorption (k) and refractive index (n) with wavelength (over a range within that of the output of the light emitting layer). Maximum absorption occurs at wavelength $\lambda_1$.

Figure 1:
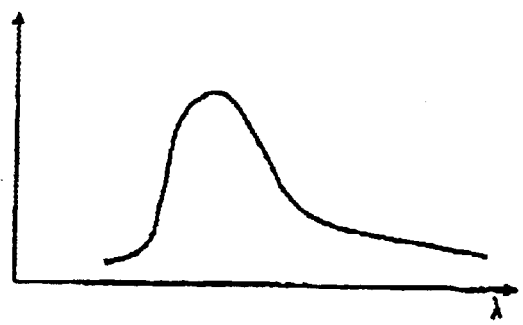
FIG. 1 illustrates the output spectrum of a conventional OELD.

As is readily apparent from a comparison of the absorption curve of FIG. 4 and the output spectrum shown in FIG. 1, the long-tail effect shown in FIG. 1 is substantially mitigated in the characteristic of the polymer layer of FIGS. 3 and 4.

As will be apparent from FIG. 4, conjugated polymers in general have a high refractive index near their absorption edge and decreasing refractive index with longer wavelengths away from the absorption edge.

Figure 5A:
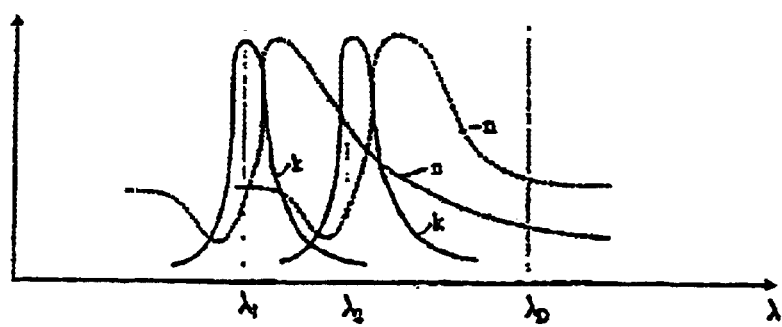
FIG. 5A is a graph illustrating together the optical characteristics shown in FIG. 4 for two materials and the relationship thereof to a design wavelength.

The graph of FIG. 5A shows the same characteristics as shown in FIG. 4, but shows these characteristics simultaneously for two different polymer layers such as might be used to form the DBR shown in FIG. 3. In FIG. 5A, the respective wavelengths at maximum absorption are $\lambda_1$ and $\lambda_2$. The DBR using these two types of polymer layers is designed for an operative wavelength of $\lambda_D$. As will be appreciated from FIG. 5A, the operative or design wavelength $\lambda_D$ is selected to avoid the high absorption peaks of the two polymer layers and to have a relatively small difference between the refractive index for the two layers. As shown in FIG. 5A, $\lambda_D$ is of longer wavelength than $\lambda_1$ and $\lambda_2$.

The characteristics shown in FIG. 4 are determined by the band gap energy of the material. Thus, FIG. 5A illustrates two relatively high band gap materials: with $\lambda_D$ being of longer wavelength than $\lambda_1$ and $\lambda_2$. Because the DBR of FIG. 3 is formed of organic materials, relatively narrow band gap materials can be used. Thus, unlike the position shown in FIG. 5A, the design wavelength $\lambda_D$ can be shorter rather than longer than the absorption edge wavelength ($\lambda_1$ or $\lambda_2$) of one of the two materials of the DBR. This possibility would appear to be unique to organic materials such as polymers. Such an arrangement is illustrated in FIG. 5B.

Figure 5B:
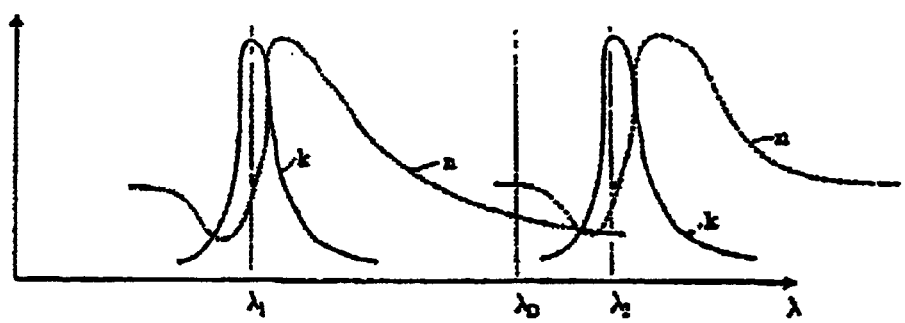
FIG. 5B is a graph similar to that of FIG. 5A but with a different relationship between the two materials and the design wavelength.

Particularly in relation to the embodiment illustrated in FIG. 5B, an important point to note is that the absorption (k) is low on either side of the peak. This is in contrast to inorganic materials, where the peak is really an edge rather than a peak and the absorption is high on the lower wavelength side of the edge. That is, in inorganic materials there is high absorption in the conductive region, which is on the shorter wavelength side of the absorption edge. The embodiment shown in FIG. 5B can exhibit reduced electrical resistance, because the material having an absorption peak wavelength ($\lambda_2$) longer than the design wavelength ($\lambda_D$) may be conductive.

A particular benefit of the structure illustrated in FIG. 3 is the fact that the refractive indices of the DBR materials can be tuned to provide the desired result. Further, absorption by the polymer layers of the DBR is largely caused by the conjugated regions of the polymer materials. Thus, beneficial arrangements can be provided by adding non-conjugated side groups to the conjugated polymer material.

This reduces the density of the conjugated regions and results in a reduction in the refractive index of the material. Alternatively, a co-polymer consisting of two groups can be formed, with one of the groups being non-conjugated. Another modification is to use mixtures or blends of polymer materials to vary the refractive index of each of the respective layers of the DBR.

Figure 6A:
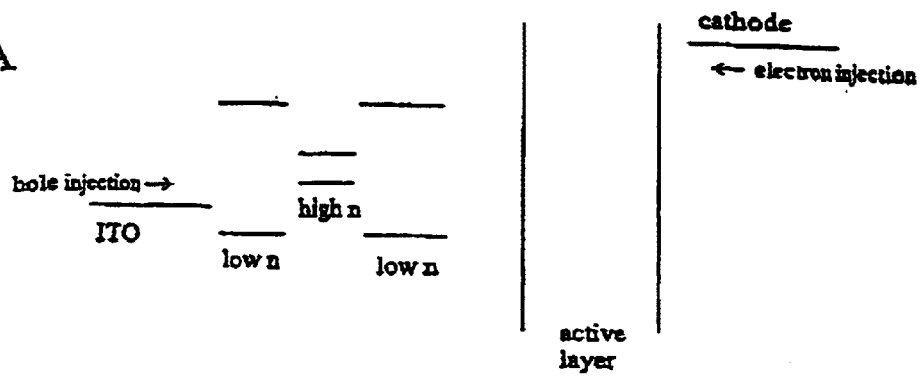
FIG. 6A is an energy level diagram useful in explaining the electrical resistance of the DBR shown in FIGS. 3 and 5A.

Another important characteristic of the DBR in the structure illustrated in FIG. 3 is the electrical resistance which is presented by the DBR. The resistance presented by the DBR can be understood from the energy level diagrams of FIGS. 6A and 6B. The basic operation of the OELD is that holes are injected by the ITO anode, electrons are injected by the cathode and the holes and electrons recombine in the electroluminescent material thus causing light to be emitted. FIG. 6A corresponds to the embodiment illustrated in FIG. 5A. As illustrated in FIG. 6A, a first polymer layer of the DBR has a relatively wide band gap (low refractive index) whereas the second polymer layer of the DBR has a relatively narrow band gap (high refractive index). Of course, the DBR would usually contain more than two polymer layers but the principle of the narrow band gap material acting as a potential barrier to the holes injected from the ITO anode can be understood from FIG. 6A. To obtain a low resistance value for the DBR the polymer materials can be selected such that the just mentioned potential barrier can effectively be ignored at room temperatures. This can be achieved by selecting the polymer materials to have a difference between the bottom energy level of their respective band gaps (sometimes referred to as the HOMO level—Highest Occupied Molecular Orbital) to be smaller than 0.6 eV.

Minimising the difference between the HOMO levels is very important since it is this difference which controls conductivity. That is, the smaller the difference between the HOMO levels of the adjacent materials the smaller the potential barrier across the junction. It is an advantage of inorganic systems that it is relatively easy to tune the band gap levels. Thus, in inorganic systems, it is relatively easy to select materials for adjacent levels with very similar HOMO levels and then to tune the band gap of the materials to produce the desired absorption levels, thus automatically determining the LUMO levels (Lowest Unoccupied Molecular Orbital). It is a disincentive against using organic materials that there are few choices for tuning the band gap levels and it is difficult to obtain HOMO levels which are close together. This disincentive can be overcome by using doping and by using graduated interfaces.

Figure 6B:
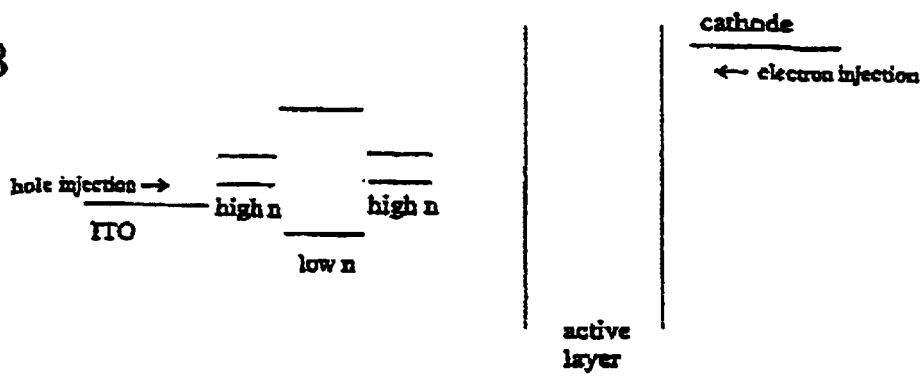
FIG. 6B is an energy level diagram useful in explaining the electrical resistance of the DBR shown in FIGS. 3 and 5B.

FIG. 6B corresponds to the embodiment illustrated in FIG. 5B. As illustrated in FIG. 6B, an effect of using materials for the DBR having respective absorption peak wavelengths ($\lambda_1$, $\lambda_2$) on either side of the design wavelength ($\lambda_D$) is that the low/high sequence of refractive index is changed to a high/low sequence.

A practical DBR suitable for use in the structure of FIG. 3 can be obtained using alternate layers of a conductive organic material with a semiconductive organic material. In such an arrangement the semiconductive material preferably has a relatively high mobility, for example>$1\times10^{-4}$ cm$^2$/V.s As noted above, a significant advantage of the structure illustrated in FIG. 3 is that techniques other than deposition can be used to fabricate the DBR. Sublimation is a relatively easy and attractive fabrication process. Although this can be used, difficulties can arise when fabricating layers of polymers. For example, the application of polymers by spin coating entails dissolving the polymer material in a solvent. When one polymer layer is formed on another, the solvent used to apply the second layer redissolves the first layer. At best an intermixture of the polymer materials occurs, at worst it becomes impossible to form a layered structure. Thus, it is a preferred aspect of the present invention to provide suitable materials for the DBR which in fabrication of the DBR use different solvents so as to avoid this problem.

Figure 7:
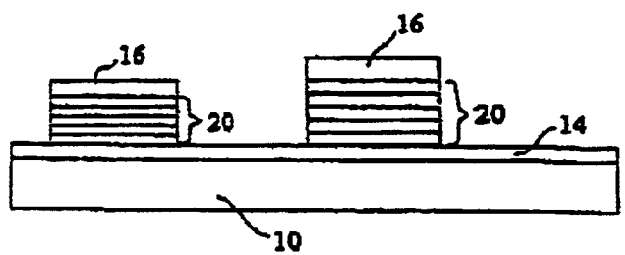
FIG. 7 illustrates a multicolour light emitting device having at least two micro-cavity structures of the type illustrated in FIG. 3.

The present invention encompasses a multicolour light emitting device having at least two micro-cavity structures with respectively different optical lengths determining their emission wavelengths with each micro-cavity being of the type described with reference to FIG. 3. An example of such a multicolour light emitting device is illustrated in FIG. 7. In FIG. 7 the same reference numerals are used as in FIG. 3 and it is believed that the structure of the multicolour device will be understood with out the need for further explanation, other than confirmation that the two micro-cavities do of course emit light of different wavelengths. Also, it will be readily apparent that the figure is schematic only. Further, although only two micro-cavities are illustrated in practice the number of micro-cavities will be higher.

The DBR described with reference to FIG. 3 can be used in other applications, for example as a multicladding layer to obtain lateral transmission within a cavity rather than transmission perpendicular to the light emitting layer as in FIGS. 2 and 3.

A number of examples of beneficial materials for use in forming the DBR of the OELD according to various embodiments of the present invention will now be described.

EXAMPLE 1

The DBR comprises alternate layers of a PEDOT material doped by PSS and a TFB material. PEDOT material, Poly-3,4-EthleneDiOxyThiophene, was first developed nearly twenty years ago and is conventionally used as an antistatic coating. TFB is a polyfluorene derivative, namely poly(9,9-dioctylfluorene-co-N-(4-butylphenyl)diphenylamine). These materials for the polymer layers both have good hole transportation properties and small absorption. There is a contrast in the refractive index between the two polymers. PSS doped PEDOT is:

- a high mobility conductive material (conductivity: 10–200 S/cm)
- a low refractive index material (around 1.55 in visible light)
- soluble in water or methanol (eg 1:10), not soluble in toluen or xylene
- of low absorption in the visible region (0.002–0.005 extinction coefficient)

TFB is:

- a semiconductive, high mobility material ($4\times10^{-4}$–$2\times10^{-3}$ cm$^2$/V.s)
- a high refractive index material (1.85 at 450 nm, 1.70 at 550 nm) soluble in toluen or xylene, not soluble in water or methanol of low absorption in the visible region (<0.001 extinction coefficient)

The HOMO level for the doped PEDOT is 4.4–5.3 eV and for the TFB is 5.4 eV. Thus the difference in these energy levels is in the range 0.1–1.0 eV.

A DBR produced by spin coating five periods of these materials produced a reflectivity >40%. The resulting OELD presented a narrow output spectrum, which is tuneable by changing the thickness of the light emissive layer.

The OELD of this example used a glass substrate, an ITO anode, F8BT [poly(9,9-dioctylfluorene-co-2,1,3-benzothiadizole)] as the light emitting material and a Ca/Al cathode.

PEDOT is an example of a material having an absorption edge wavelength longer than the design wavelength of the OELD.

Modification 1 of Example 1

In this modification, the PSS doped PEDOT material was diluted with polyvinylalcohol, or polyacrylate, or polymethacrylate. The refractive index of the lower index material is reduced.

The effect was to reduce the absorption of the PEDOT material to 0.0002–0.0005 extinction coefficient (ie by an order of magnitude) and to reduce the refractive index to 1.45–1.50 in the visible region. The material retained sufficient conductivity and the driving voltage of the OELD remained low. That is, the V-I characteristics of the device were not significantly degraded. Meanwhile the reflectivity of the DBR increased to >55%.

Modification 2 of Example 1

In this modification, the TFB was blended with F8BT. The refractive index of the higher index material is increased.

The TFB has a refractive index at 550 nm of 1.71 whereas the F8BT has a refractive index of 1.92 at 550 nm. A blend of 20%:80% TFB:F8BT gave a refractive index of 1.85 at 550 nm. The HOMO level of F8BT is 6 eV which is high in comparison to that of PEDOT. However, the result of the DBR according to this modification was to increase the reflectivity to >60%, while still maintaining a low driving voltage. It would appear that polymer domains form in the TFB/F8BT blend which helps to maintain a low barrier path.

EXAMPLE 2

The DBR comprises alternate layers of F8 material and F8BT material.

The F8 material is poly(9,9-dioctylfluorene) and this has a refractive index at 550 nm of 1.65. The F8 material has a HOMO level of 5.8–6.0 eV.

The DBR of this example is used in an OELD having a glass substrate, an ITO anode, a PEDOT layer, the F8/F8BT DBR, F8BT as the light emissive material and a Ca/Al cathode.

Both materials of the DBR of this example have absorption edge wavelengths which are shorter than the design wavelength of the OELD. Both materials are soluble in the same solvent and some degradation occurs at the boundaries between the two materials. However, this can be within acceptable limits due to the large molecular weights of the materials, which require long time periods to dissolve into solution.

EXAMPLE 3

The DBR comprises alternate layers of F8 material and F6 material. This is an example of reducing the density of conjugated groups.

The F6 material is poly(9,9-dihexylfluorene) and this has a refractive index at 450 nm of 2.1. The refractive index of F8 at 450 nm is 1.85. The HOMO level of F6 is 5.8–6.0 eV.

The DBR of this example is used in an OELD having a glass substrate, an ITO anode, a PEDOT layer, the F8/F6 DBR, F6 as the light emissive material and a Ca/Al cathode.

As implied by there names, F8 has an alkyl chain containing 8 carbon atoms and F6 has an alkyl chain containing 6 carbon atoms. Thus, F8 reduces the refractive index more than F6 because of it's longer side chain.

EXAMPLE 4

The DBR comprises alternate layers of PEDOT and Alq3 (Aluminum chelate).

The main characteristic of this example is that the PEDOT material is applied by spin coating and the Alq3 material is applied by sublimation. Alq3 is not a polymer. It is a low molecular system, having a high refractive index around 500 nm and it does not dissolve in solvent.

EXAMPLE 5

The DBR comprises alternate layers of TPD and Alq3.

The TPD material has a refractive index of 1.6 at 530 nm and the Alq3 material has a refractive index of 1.9 at 530 nm. Both materials are applied by sublimation.

EXAMPLE 6

The main characteristic of this example is that a patterned DBR is formed by the deposition of PEDOT material and TFB material using inkjet technology. Thus, different DBR thickness layers can easily be provided to produce different wavelength areas on a single substrate.

EXAMPLE 7

In this example PEDOT material and another material are used for the alternate layers of the DBR. The main characteristic of the example is that the PEDOT material is doped with a dye. The dye doped layers of the DBR acts as absorption cavities. That is a large field intensity is produced even in thin layers. The result is very efficient light absorption. Thus, the absorption is used to change the colour output of the OELD.

Strictly, in this example the nature of the DBR is altered by the introduction of one or more absorption cavities. However, this arrangement is considered to fall within the expression DBR as used herein.

An OELD according to this example may have the following structure: glass substrate, ITO anode, dye doped PEDOT layer, TFB layer, PEDOT layer, light emitting layer, cathode.

A benefit of the arrangement of this example is that the long-tail effect is substantially reduced.

A further example of a material which may be used, in place of TFB, in the formation of a DBR according to the present invention is PFMO, namely poly(9,9-dioctylfluorene-co-bis-N,N'-(4-methoxyphenyl)-bis-N,N'-phenyl-1,4-phenylenediamine). This material has a high refractive index, of approximately 1.8, around the adsorption edge and a HOMO level of 5.0 eV.

What is claimed is:

1. A distributed Bragg reflector comprising a stack of alternate layers of a first material and a second material, wherein the first and second materials are both organic materials and the difference in HOMO energy levels of the first and second materials is less than 0.6 eV.

2. A distributed Bragg reflector as claimed in claim 1, wherein the first and second materials are both polymer materials.

3. A distributed Bragg reflector as claimed in claim 1, wherein one of the first and second materials comprises a conjugated polymer to which non-conjugated side groups have been added.

4. A distributed Bragg reflector as claimed in claim 1, wherein one of the first and second materials comprises a co-polymer having two groups, one of which is a non-conjugated polymer group.

5. A distributed Bragg reflector as claimed in claim 1, wherein one of the first and second materials comprises a blend or mixture of polymers.

6. A distributed Bragg reflector as claimed in claim 1, wherein one of the first and second materials is soluble in an organic solvent other than methanol but not soluble in water or methanol and the other of the said materials is soluble in water or methanol and not soluble in the said organic solvent.

7. A distributed Bragg reflector as claimed in claim 1, wherein one of the first and second materials comprises poly-3,4-ethylenedioxythiophene.

8. A distributed Bragg reflector as claimed in claim 7, wherein the poly-3,4-ethylenedioxythiophene is doped with PSS.

9. A distributed Bragg reflector as claimed in claim 8, wherein the PSS doped poly-3,4-ethylenedioxythiophene is diluted with polyvinylalcohol, or polyacrylate, or polymethacrylate.

10. A distributed Bragg reflector as claimed in claim 7, wherein the poly-3,4-ethylenedioxythiophene is doped with a dye.

11. A distributed Bragg reflector as claimed in claim 1, wherein one of the first and second materials comprises a polyfluorene derivative.

12. A distributed Bragg reflector as claimed in claim 11, wherein the polyfluorene derivative is poly(9,9-dioctylfluorene-co-N-(4-butylphenyl)diphenylamine).

13. A distributed Bragg reflector as claimed in claim 12, wherein the poly(9,9-dioctylfluorene-co-N-(4-butylphenyl)diphenylamine) is blended with poly(9,9-dioctylfluorene-co-2,1,3-benzothiadizole).

14. A distributed Bragg reflector as claimed in claim 1, wherein one of the first and second materials comprises poly(9,9-dioctylfluorene) and the other of said materials comprises poly(9,9-dioctylfluorene-co-2,1,3-benzothiadizole).

15. A distributed Bragg reflector as claimed in claim 1, wherein one of the first and second materials comprises poly(9,9-dioctylfluorene) and the other of said materials comprises poly(9,9-dihexylfluorene).

16. A distributed Bragg reflector as claimed in claim 1, wherein one of the first and second materials comprises poly-3,4-ethylenedioxythiophene and the other of said materials comprises aluminum chelate.

17. A distributed Bragg reflector as claimed in claim 1, wherein one of the first and second materials comprises poly(9,9-dioctylfluorene-co-N-(4-butylphenyl)diphenylamine) and the other of said materials comprises aluminum chelate.

18. A distributed Bragg reflector as claimed in claim 1, wherein one of the first and second materials comprises poly(9,9-dioctylfluorene-co-bis-N,N'-(4-methoxyphenyl)-bis-N, N' phenyl-1,4-phenylenediamine).

19. An organic electroluminescent light emitting element comprising:

a transparent substrate;

a transparent electrode formed on the substrate;

a distributed Bragg reflector formed on the transparent electrode;

an organic electroluminescent light emitting material formed on the distributed Bragg reflector; and an electrode formed on the light emitting material, the distributed Bragg reflector comprising a stack of alternate layers of a first material and a second material, wherein the first and second material are both organic materials.

20. An organic electroluminescent light emitting element as claimed in claim 19, wherein one of the first and second materials has a peak absorption wavelength which is longer than the mode wavelength of the device.

21. An organic electroluminescent light emitting element as claimed in claim 19, wherein the light emitting material is poly(9,9-dioctylfluorene-co-2,1,3-benzothiadizole).

22. A multicolour light emitting device comprising a plurality of light emitting elements as claimed in claim 19.

23. A multicolour light emitting device as claimed in claim 22, wherein the first and second materials are formed in different thickness layers and provide different mode wavelength areas on the substrate.

24. A method of manufacturing an organic electroluminescent light emitting element, comprising the steps of:

providing a transparent substrate;

forming a transparent electrode formed on the substrate;

forming a distributed Bragg reflector on the transparent electrode by forming a stack of alternate layers of a first organic material and a second organic material using inkjet technology;

forming an organic electroluminescent light emitting material on the distributed Bragg reflector; and forming an electrode on the light emitting material.

25. A method of manufacturing a multicolour light emitting device comprising the steps of:

forming a plurality of light emitting elements using the method of claim 24; and forming therein the first and second materials in different thickness layers to provide different mode wavelength areas on the substrate.

* * * * *

UNITED STATES PATENT AND TRADEMARK OFFICE
CERTIFICATE OF CORRECTION

PATENT NO. : 6,756,732 B1
DATED : June 29, 2004
INVENTOR(S) : Takeo Kawase

It is certified that error appears in the above-identified patent and that said Letters Patent is hereby corrected as shown below:

Title page,
Item [73], Assignee, Cambridge University Technical Services, Ltd., Cambridge (GB), please replace the Assignee with the following joint Assignees:
-- Seiko Epson Corporation, Tokyo (JP) and Cambridge University Technical Services Limited Of The Old Schools, Cambridge (GB) --.

Signed and Sealed this

Twelfth Day of October, 2004

JON W. DUDAS
*Director of the United States Patent and Trademark Office*